United States Patent
Schulz et al.

(10) Patent No.: US 10,577,707 B2
(45) Date of Patent: Mar. 3, 2020

(54) METHODS AND APPARATUS FOR DEPOSITING A METAL LAYER ON A SEMICONDUCTOR DEVICE

(71) Applicant: Semikron Elektronik GmbH & Co., KG, Nürnberg (DE)

(72) Inventors: Wolfgang-Michael Schulz, Zirndorf (DE); Matthias Spang, Stein (DE)

(73) Assignee: Semikron Elektronik GmbH & Co., KG, Nürnberg (DE)

( * ) Notice: Subject to any disclaimer, the term of this patent is extended or adjusted under 35 U.S.C. 154(b) by 4 days.

(21) Appl. No.: 14/682,945

(22) Filed: Apr. 9, 2015

(65) Prior Publication Data
US 2015/0292100 A1  Oct. 15, 2015

(30) Foreign Application Priority Data

Apr. 9, 2014 (DE) .......................... 10 2014 105 066

(51) Int. Cl.
*C25D 7/12* (2006.01)
*C25D 17/00* (2006.01)
(Continued)

(52) U.S. Cl.
CPC .................. *C25D 7/12* (2013.01); *C25D 5/02* (2013.01); *C25D 17/001* (2013.01); *H01L 24/27* (2013.01);
(Continued)

(58) Field of Classification Search
CPC ................................ C25D 7/12; C25D 17/001
(Continued)

(56) References Cited

U.S. PATENT DOCUMENTS 3,962,047 A * 6/1976 Wagner ............... C25D 5/02
    204/DIG. 7
4,259,166 A * 3/1981 Whitehurst .......... C25D 17/008
    204/279
(Continued)

FOREIGN PATENT DOCUMENTS

DE   10 2009 018 360   11/2010
DE   10 2011 051 822   1/2012
(Continued)

OTHER PUBLICATIONS

Machine translation of DE 102011005743 of Berberich, published in 2012.*
(Continued)

*Primary Examiner* — Brian W Cohen
(74) *Attorney, Agent, or Firm* — The Law Offices of Roger S. Thompson

(57) ABSTRACT

Method and apparatus for the electrodeposition of a contact metal layer on contact areas of semiconductor components in a wafer assemblage. The method comprises: a) providing a wafer having components having at least one pn junction; b) arranging a non-conductive homogenizing device with respect to the first surfaces of the components, and an electrical contact device at a second surface of the wafer; c) introducing the wafer into an electroplating bath having an electrode, wherein the surface thereof consists at least partly of a first contact metal, and wherein the first surface of the components is in contact with the electroplating bath; d) applying a voltage to the electrode and to the contact device, as a result of which current flows between the electrode and the contact device, through the electroplating bath and the component and contact metal is thus deposited at the first contact areas of the components.

6 Claims, 5 Drawing Sheets

(51) Int. Cl.
    *C25D 5/02*    (2006.01)
    *H01L 23/00*   (2006.01)
    *C25D 7/00*    (2006.01)
(52) U.S. Cl.
    CPC .............. *H01L 24/94* (2013.01); *C25D 7/008* (2013.01); *H01L 2224/27462* (2013.01); *H01L 2924/01029* (2013.01)
(58) Field of Classification Search
    USPC .................................................... 204/297.05
    See application file for complete search history.

(56) References Cited

U.S. PATENT DOCUMENTS

| | | | |
|---|---|---|---|
| 6,402,923 B1 | 6/2002 | Mayer et al. | |
| 6,468,806 B1 * | 10/2002 | McFarland | B01J 19/0046 205/118 |
| 7,070,686 B2 * | 7/2006 | Contolini | C25D 17/008 204/212 |
| 9,029,200 B2 | 5/2015 | Zelsacher et al. | |
| 2004/0168925 A1 * | 9/2004 | Landau | C25D 21/12 205/81 |
| 2011/0308955 A1 | 11/2011 | Olson | |
| 2012/0261254 A1 * | 10/2012 | Reid | C25D 7/123 204/227 |

FOREIGN PATENT DOCUMENTS

| | | |
|---|---|---|
| DE | 10 2011 005 743 | 7/2012 |
| JP | S60-128 615 | 7/1985 |

OTHER PUBLICATIONS

Official Action from the Chinese Patent Office, dated Feb. 3, 2019.

* cited by examiner

METHODS AND APPARATUS FOR DEPOSITING A METAL LAYER ON A SEMICONDUCTOR DEVICE

BACKGROUND OF THE INVENTION

1. Field of the Invention

The invention is directed to method and apparatus for depositing a metal layer, more precisely a first contact metal layer, on a contact area of a semiconductor component, preferably of a power semiconductor component, which is arranged in a matrix-like fashion in a wafer assemblage.

2. Description of the Related Art

The prior art, such as disclosed in German Patent Application Ser. No. DE 10 2011 005 743 B3, reveals a method for the electrodeposition of a first contact metal layer on contact areas of a plurality of semiconductor components present in a wafer assemblage and having a pn junction, the p-doped volume region of which adjoins a first surface and the n-doped volume region of which adjoins a second surface and forms second contact areas there. In this case, the second surface of the semiconductor components is enclosed by a contact device in a liquid-tight fashion, wherein the contact device has at least one contact element in electrical contact with second contact areas of the semiconductor components and an external connection element. The semiconductor components with an arranged contact device are introduced into an electroplating bath having at least one electrode and a DC voltage is applied to the electrode and to the connection element of the contact device, as a result of which metal of the electrode deposits at the first contact areas of the semiconductor components. What is problematic, in principle, is that in this case the deposition takes place inhomogeneously, or unevenly, over the wafer assemblage, since it has been found that the deposition takes place to a significantly greater extent at the edge than in the center of a wafer.

There is therefore a need in the art to provide an improved method and apparatus for electrodepositing metal contact areas on ("metallizing") semiconductor components.

SUMMARY OF THE INVENTION

It is an object of the invention to provide an improved method and apparatus for electrodepositing metal contact areas on semiconductor components, whereby a more homogeneous deposition of the contact metal layer on a wafer is achieved than heretofore known, the contact areas are positioned more precisely on semiconductor components present in the wafer assemblage.

The method according to the invention for the electrodeposition of a first contact metal layer on first contact areas of a plurality of semiconductor components which are arranged in a matrix-like pattern in a wafer assemblage comprises the following steps, preferably proceeding in this order:

a) providing a wafer, that is to say the semiconductor components in the wafer assemblage, wherein each semiconductor component has at least one pn junction and thus respectively a volume region of first and second doping, wherein a volume region of first doping adjoins a first surface of the respective semiconductor component and forms the respective first contact area there and a volume region of second doping adjoins a second surface of the respective semiconductor component and forms a second contact area there;

b) arranging an electrically non-conductive homogenizing device with respect to a first surface of the wafer and thus with respect to the first surfaces of the semiconductor components, and an electrical contact device at a second surface—opposite the first surface—and preferably also at an edge area of the wafer;

c) introducing the wafer with the arranged electrical contact device into an electroplating bath having an electrode, wherein the surface of the electrode consists at least partly of a first contact metal, and wherein the first surface of the semiconductor components is in contact with the electroplating bath; and d) applying a voltage, preferably a constant or pulsating DC voltage, to the electrode and to the contact device, as a result of which current flows between the electrode through the electroplating bath and the semiconductor component and the contact device and contact metal is thus deposited at the first contact areas of the semiconductor components with a fluctuation of the average layer thickness of less than about 5% from semiconductor component to semiconductor component.

It is particularly advantageous if the first metal contact layer has a thickness of between about 1 µm and about 200 µm, preferably between about 5 µm and about 20 µm.

Furthermore, it can likewise be advantageous if the first metal contact layer consists of at least about 90% copper, and more preferably consists completely of copper.

In particular, it is advantageous if the wafer is enclosed in the contact device in a liquid-tight fashion such that its second surface is protected against contact with the electroplating bath, wherein the contact device has an external connection element.

Advantageous configurations arise if the homogenizing device is in direct contact with the first surface of the wafer or is spaced apart from said first surface by no more than about 25 mm.

A first apparatus according to the invention for the electrodeposition of a first contact metal layer on first contact areas of a plurality of semiconductor components which are arranged in a matrix-like pattern in the wafer assemblage comprises: a first homogenizing device, which is designed for arrangement with respect to the wafer and in this case covers at least the outermost series of semiconductor components to be metallized and has a cutout above each of these covered semiconductor components to be metallized, said cutout having an opening area having a maximum of about 90%, preferably a maximum of about 80%, of the surface area of the first contact area of the assigned semiconductor component.

As a result, the opening area restricts the free access of the electroplating liquid and thus of the contact metal ions to the contact area to be metallized, as a result of which the homogeneous deposition is obtained over the wafer.

In this case, the term "series" is understood to mean a plurality of semiconductor components which lie approximately on imaginary concentric circles around the midpoint of the wafer. The outermost series of semiconductor components thus has no further adjacent semiconductor component in the direction of the edge of the wafer. Further series in the direction of the center of the wafer have at least one neighbor from a series situated further outwards. In the case of square semiconductor components, this means that the relevant semiconductor component is adjacent to at least one edge of a neighbor from the directly outwardly neighboring series. The term "opening area" should be understood to mean that region of the assigned cutout which has the smallest surface area parallel to the surface of the wafer. A spacing of the opening area should be understood to mean the minimum spacing between the first surface of the wafer and the opening area.

Particularly in the case of small semiconductor components, in particular having an area of less than about 1 mm$^2$, it can be preferred to abandon the direct assignment of the cutout to the semiconductor component and to provide cutouts which are assigned to a group of diodes. Preferably, here the cutouts lie on a circle that is concentric with respect to the midpoint of the wafer. This achieves in principle the same effect as described above, namely the free access of the contact metal ions to the semiconductor components is restricted. For a uniform deposition, it is necessary in this case to choose the spacing of the opening area from the contact area to be large enough so that the deposition can take place homogeneously on the group.

It can be preferred if the surface area of the opening area of the cutouts increases from series to series monotonically, preferably strictly monotonically, from the edge of the wafer in the direction of the center of the wafer.

Furthermore, it is preferred if the opening areas of the cutouts are round or configured to correspond to the basic shape of the assigned semiconductor component, in particular the first contact area thereof.

Particularly advantageous configurations arise if the homogenizing device bears directly on the wafer and the cutouts have edges running at an angle of between about 10° and about 45° from the perpendicular, or if the homogenizing device is arranged in a manner spaced apart from the wafer.

A second apparatus according to the invention for the electrodeposition of a first contact metal layer on first contact areas of a plurality of semiconductor components which are present in the wafer assemblage and which are arranged in a matrix-like fashion, comprises a second homogenizing device, which is designed for arrangement with respect to a wafer and in this case covers the outermost series of semiconductor components to be metallized to the extent of at least about 50% from the edge of the wafer.

It is particularly advantageous in this case if the homogenizing device bears with a foot region directly on the wafer and an edge of said foot region runs perpendicularly to the first surface of the wafer or at an angle of between about 10° and about 45° from the perpendicular, or if the homogenizing device is arranged in a manner spaced apart from the wafer.

For the first and second homogenizing devices it can be advantageous if said homogenizing device consists of a non-conductive material, preferably a high-temperature-resistant plastic of the polyaryl ether ketones, preferably of polyether ether ketone.

A sealing device assigned to the homogenizing device and serving for the liquid-tight enclosure of the wafer in the contact device advantageously consists of a synthetic rubber embodied as a terpolymeric elastomer, preferably composed of ethylene-propylene-diene rubber.

It goes without saying that the different configurations of the invention, that is to say of the method and also of the apparatuses, can be realized individually or in arbitrary combinations in order to achieve improvements. In particular, the features mentioned above and explained here or hereinafter can be used not only in the combinations indicated, but also in other combinations or by themselves, without departing from the scope of the present invention.

Other objects and features of the present invention will become apparent from the following detailed description of the presently preferred embodiments, considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

DETAILED DESCRIPTION OF THE PRESENTLY PREFERRED EMBODIMENTS

Figure 1:
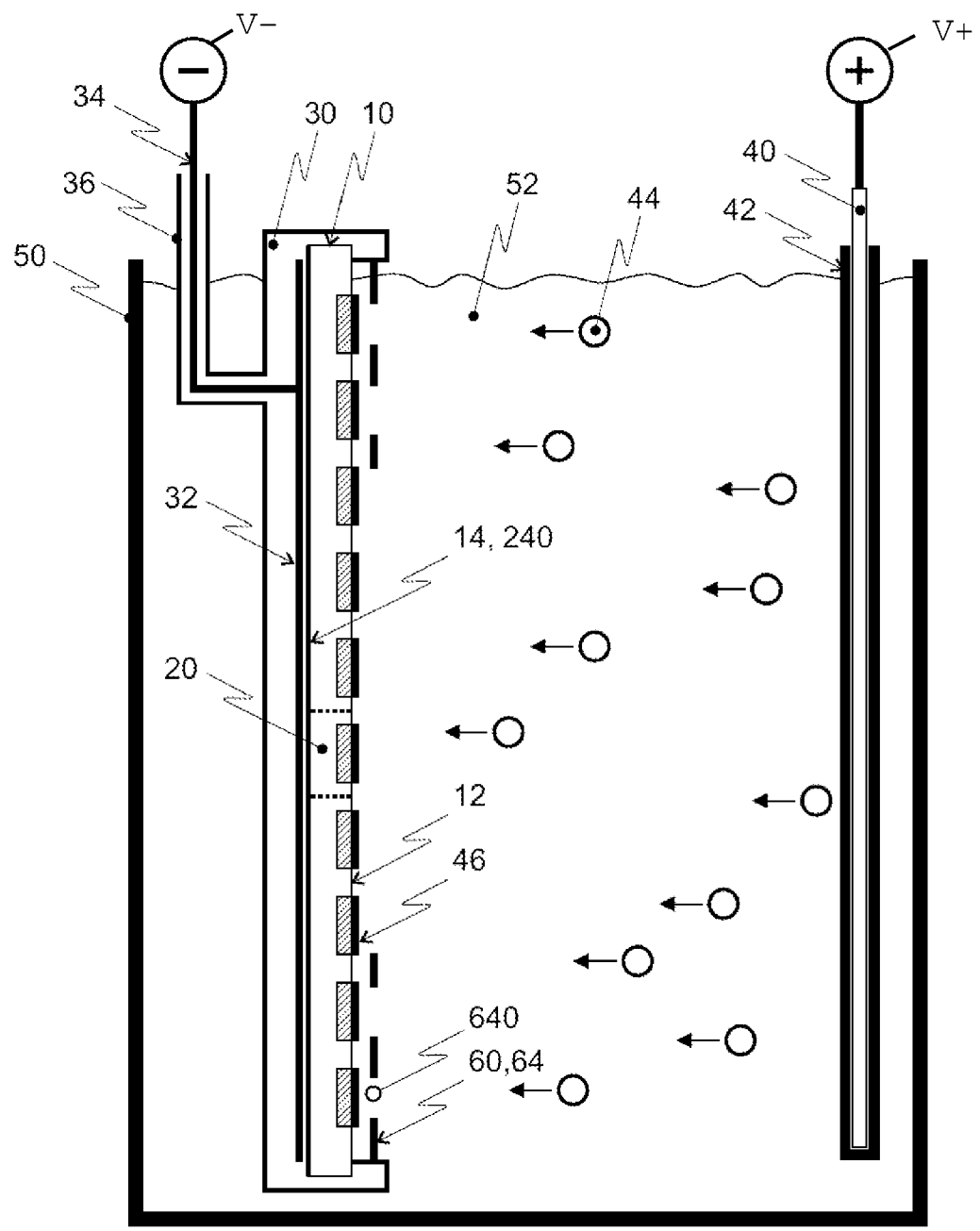
FIG. 1 shows an apparatus in accordance with the invention for performing the inventive method.

FIG. 1 shows an inventive apparatus for performing the method according to the invention. The illustration shows a basin 50 with an electroplating bath 52, for example a solution of copper sulphate ($CuSO_4$) in a concentration of the order of magnitude of 100 grams per liter, in which an electrode 40 is provided. Electrode 40 is connected to the positive pole V+ of a voltage source. Electrode 40 serves to release copper ions 44 to electroplating bath 52 and for this purpose has a core composed of a further metal and a sheathing 42 of said core with pure copper. Preference may also be given to providing sheathing 42 composed of a mixture comprising a proportion of at least about 90% copper and some other metal.

The illustration likewise shows a plurality of semiconductor components 20, here power diodes, in a wafer 10 which is part of a larger wafer assemblage. Wafer 10 thus present forms, with the exception of its edge region, a two-dimensional matrix of directly adjacent semiconductor components 20. The respective semiconductor component 20, here the power diode, has a p-doped volume region 22 extending into the semiconductor material from its first surface 220, which is simultaneously first surface 12 of wafer 10, said volume region usually being embodied in a well-like fashion and not extending right up to the boundaries 100, cf. FIG. 6 or 7, with respect to the closest power diode 20. First surface 220 simultaneously forms the first contact area of the respective power diode 20. Other semiconductor components 20 can have a plurality of functionally identical, or different, first contact areas, all of which, however, are characterized in that they are assigned to a p-doped volume region 22.

The rear side, that is to say the second surface 14 of wafer 10 and thus of semiconductor components 20, has a second contact area. In this configuration of semiconductor components 10, said contact area extends as far as boundary 100 of the adjacent power diodes 20, as a result of which as it were a continuous contact area of wafer 10 is formed.

Rear side 14 and also the edge region of wafer 10, in some configurations additionally that section of the front side 12 which directly adjoins said edge region, are enclosed in a liquid-tight manner by means of a contact device 30.

Contact device 30 has a contact element 32 on its inner side facing second surface 14, the rear side, of wafer 10, contact element 32 being in electrical contact with second contact areas 240 of all the power diodes 20 to be coated, irrespective of whether said contact areas are present separately from one another or, as here, as a common contact area. Contact device 30 is electrically insulated 36 towards electroplating bath 52, as a result of which copper is not deposited on second surface 14 and a short circuit of the pn junction via electroplating bath 52 is thus avoided.

Furthermore, contact device 30 has an external connection element 34, which leads to the negative pole V− of the voltage source likewise in a manner electrically insulated from the liquid of electroplating bath 52. In the interior of contact device 30, external connection element 34 is electrically conductively connected to contact element 32 of contact device 30.

The voltage source is to be provided with a voltage of at least about 2.5 V, preferably between about 6 V and about 8 V, since, in the context of the inventive method, the threshold voltage of the pn junction of typically about 0.7 V must also be overcome in order to ensure a current flow through the volume-conductive power diode 20.

A homogenizing device 60, 64 is arranged in a manner spaced apart from first surface 12 of wafer 10 by virtue of the fact that it is connected to contact device 30. Homogenizing device 64 covers the two respectively outermost semiconductor components. To put it another way, homogenizing device 64 covers the semiconductor components arranged in a first and second series, and has an assigned cutout 640 with respect to each of said semiconductor components. Cutouts 640 are aligned with the semiconductor components. The cutouts assigned to the first, outermost, series have a surface area of the opening area which amounts to about 60% of the surface of the surface area of the assigned semiconductor component.

The spacing of homogenizing device 64 and in this configuration also of its opening area here is 10 mm ± about 2 mm, wherein the wafer has a diameter of about 15 cm and the surface areas of each semiconductor component is about 1 cm².

According to the inventive method, copper ions 44 dissolved in electroplating bath 52 deposit exclusively at first contact areas 220 of the semiconductor components 20 connected to the p-doped volume regions 22. No deposition takes place at the adjacent sections of first surface 12 of wafer 10, or of the respective semiconductor component 20, which are connected to an n-doped volume region 24, cf. FIG. 6 or 7, of semiconductor component 20. In a routine manner in the art, these parts of first surface 12 can be covered with an insulating layer serving as passivation.

The method permits a deposition rate of between about 100 nm/minute and about 2000 nm/minute, as a result of which, for example, a thickness of first contact metal layer 46 of about 10 μm is achieved after a residence duration of from about 5 to about 100 minutes under voltage. A fluctuation of the average layer thickness of less than about 5% from semiconductor component to semiconductor component, that is to say as viewed over all the semiconductor components, is obtained by means of the inventive homogenizing device.

Figure 2:
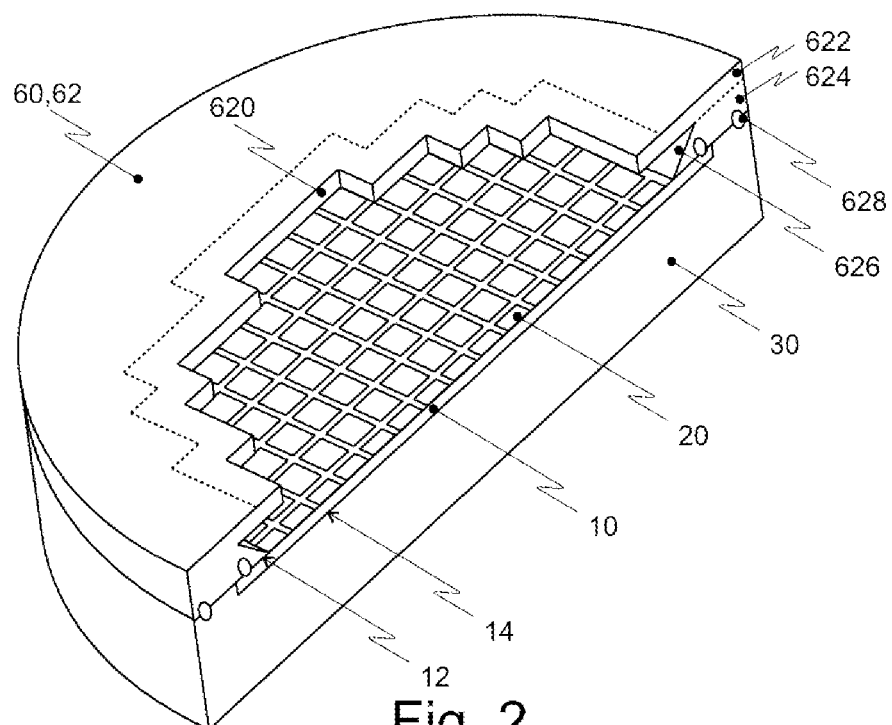
FIG. 2 shows a three-dimensional section through a second homogenizing device arranged with respect to a wafer.

FIG. 2 shows a three-dimensional section through a second homogenizing device 60, 62 arranged with respect to a wafer 10. In this case, homogenizing device 62 bears directly on the edge of wafer 10 in the region in which no semiconductor components 20 are provided. Homogenizing device 62 is sealed with respect to a contact device 30 (also illustrated) by means of sealing devices 628 so that no liquid of the electroplating bath can pass to the rear side 14 of wafer 10 during use in the method.

Homogenizing device 62 is annular in shape, relative to the projection onto first surface 12 of wafer 10, wherein the inner edge of the annulus generally follows the contour of semiconductor components 20. Moreover, homogenizing device 62 has a foot region 624, with which a disc-shaped part 622 of second homogenizing device 62 rises up on first surface 12 of wafer 10. The outer contour of the first series of semiconductor components 20 is illustrated in a dashed manner. The opening, the area thereof in the sense described above, of the inner edge of disc-shaped part 622 is spaced apart from first surface 12 of wafer 10. Edges 626 of homogenizing device 62 which extend from first surface 12 to the opening are at an angle with respect to the perpendicular, which faces radially outwards here without any restriction of generality. The opening here has a spacing of 14 mm ± about 2 mm from first surface 12 of wafer 10, which surface, at the beginning of the process, is identical, or at least approximately identical, to the first surface of the respective semiconductor components. The dimensions of wafer 10 correspond to those mentioned above in the case of FIG. 1.

Figure 3:
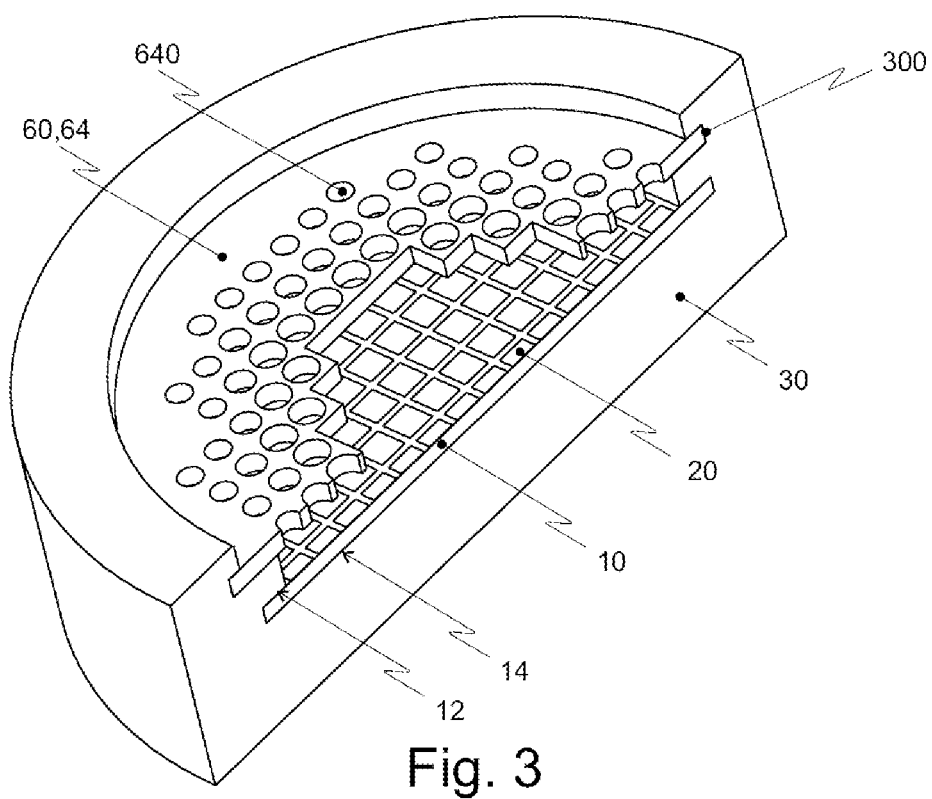
FIG. 3 shows a three-dimensional section through a first homogenizing device arranged with respect to a wafer.

FIG. 3 shows a three-dimensional section through a first homogenizing device 60, 64 arranged with respect to a wafer 10. A contact device 30 seals rear side 14 of wafer 10 against the liquid of electroplating bath 52 by virtue of the fact that it encloses wafer 10 at rear side 14 thereof, the second surface and also at the edge surface and the adjoining regions of first surface 12.

Figure 5:
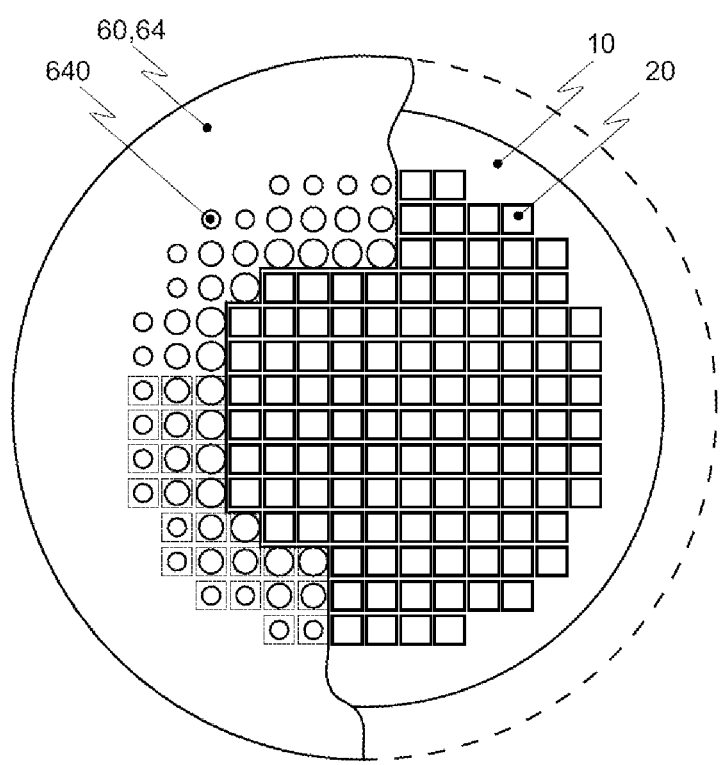
FIG. 5 shows a second homogenizing device arranged with respect to semiconductor components in the wafer assemblage in accordance with FIG. 4.

Homogenizing device 64 is once again shaped as an annulus, relative to the projection onto first surface 12 of wafer 10, and for the rest in a disc-shaped fashion, wherein the inner edge likewise follows the contour of semiconductor components 20, cf. FIG. 5, here the third series of the semiconductor components. The outer edge of homogenizing device 64 is arranged in a groove 300 of contact device 30 and is thus spaced apart from first surface 12 of wafer 10.

In addition, homogenizing device 64 has, with respect to each covered semiconductor component 20, an assigned cutout 640 aligned with semiconductor component 20 and having an opening. In this case, without any restriction of generality, the edges of cutouts 640 of homogenizing device 64 run perpendicularly to first surface 12 of wafer 10. The dimensions of wafer 10 correspond to those mentioned above in the case of FIG. 1.

In both configurations of homogenizing device 60 in accordance with FIGS. 2 or 3, homogenizing device 60 consists of a non-conductive material, here of polyether ether ketone. Necessary sealing devices consist of a synthetic rubber, here of ethylene-propylene-diene rubber.

Figure 4:
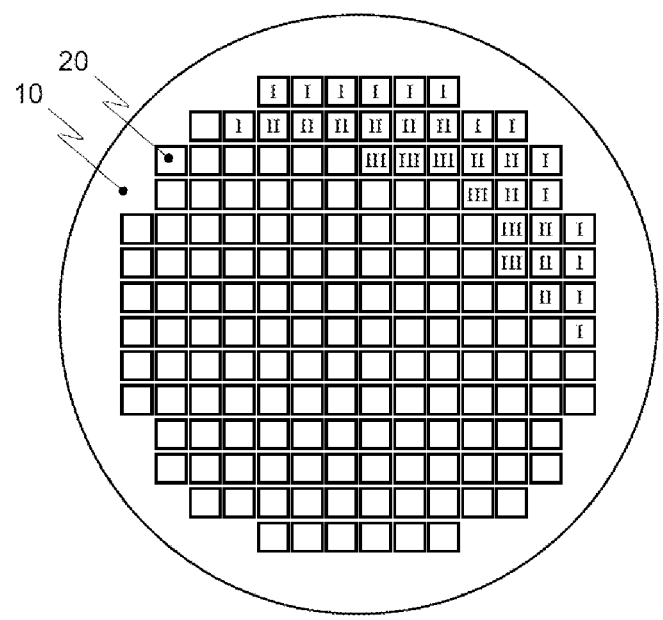
FIG. 4 shows semiconductor components in the wafer assemblage in plan view.

FIG. 4 shows semiconductor components 20 in the wafer assemblage in plan view. Such a configuration is routine in the art for wafers 10 having semiconductor components embodied as power semiconductor components, in particular as diodes or thyristors. In particular, the nomenclature of the series of semiconductor components 20 is clarified here. Three series of semiconductor components 20 are designated by Roman numerals here. The first series (I) forms the outermost series, and the second series (II) and the third series (III) are adjacent thereto in the direction of the center of the wafer.

FIG. 5 shows a first homogenizing device 64 arranged with respect to semiconductor components 20 in the wafer assemblage in accordance with FIG. 4. The illustration here shows that cutouts 640 of homogenizing device 64 which are assigned to semiconductor components 20 of the first series I have the smallest opening area, here about 40% of the surface area of the assigned semiconductor component. The opening area of the cutouts assigned to the second series II of semiconductor components has an opening area of about 60% of the assigned semiconductor component. The opening area of the cutouts assigned to the third series III of semiconductor components has an opening area of about 85% of the assigned semiconductor component. The respectively assigned semiconductor components are illustrated partly in a dashed manner.

Figure 6:
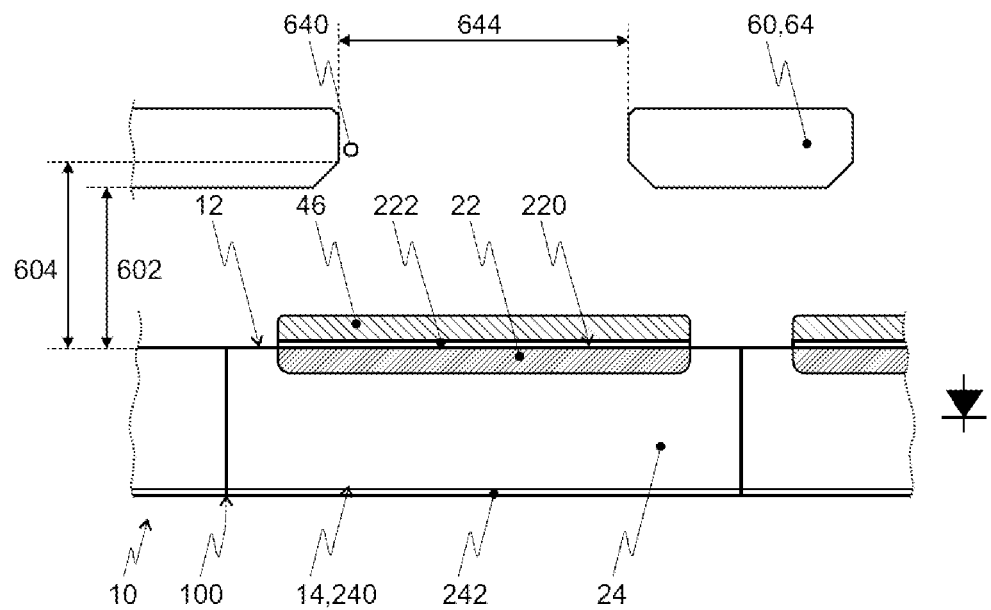
FIG. 6 shows a two-dimensional section through a second homogenizing device arranged with respect to a wafer.

FIG. 6 shows in an excerpt a two-dimensional section through a first homogenizing device 64 arranged with respect to a wafer 10. The illustration corresponds to that in accordance with FIG. 5. However, here the inner edge of cutout 640 of homogenizing device 64 is of more complex design. The spacing 602 of homogenizing device 60 with respect to first surface 12 of wafer 10 here is smaller than the spacing 604 of the opening area of the cutout. The cutout has an opening area having a surface area 644 of about 60% of the surface area of the assigned first contact area 220 of the semiconductor component 20.

The illustration shows an excerpt from a wafer 10 having semiconductor components 20 adjoining in the wafer assemblage. In this case, each semiconductor component 20 is a diode whose cathode 24 is n-doped and which has a p-doped well region as anode 22. Cathode 24 furthermore has a rear-side metallization 240, as also described, in principle, with respect to the embodiment of FIG. 1.

An already deposited first contact metal layer 46 is also illustrated. Between first contact metal layer 46 and first surface 12 of wafer 10, a second contact metal layer 222 is additionally arranged in the region of first contact area 220 of anode 22 of semiconductor component 20, which second contact metal layer 222 can be embodied as an adhesion layer and alternatively or additionally also as a barrier layer. Second contact metal layer 222 can thus improve the adhesion with first contact metal layer 46, and also prevent the diffusion of atoms of first contact metal layer 46 into the semiconductor body, more precisely into anode 22 thereof. In this case, in a routine manner in the art, second contact metal layer 222 can also be embodied as a layer sequence of a plurality of metal layers.

Figure 7:
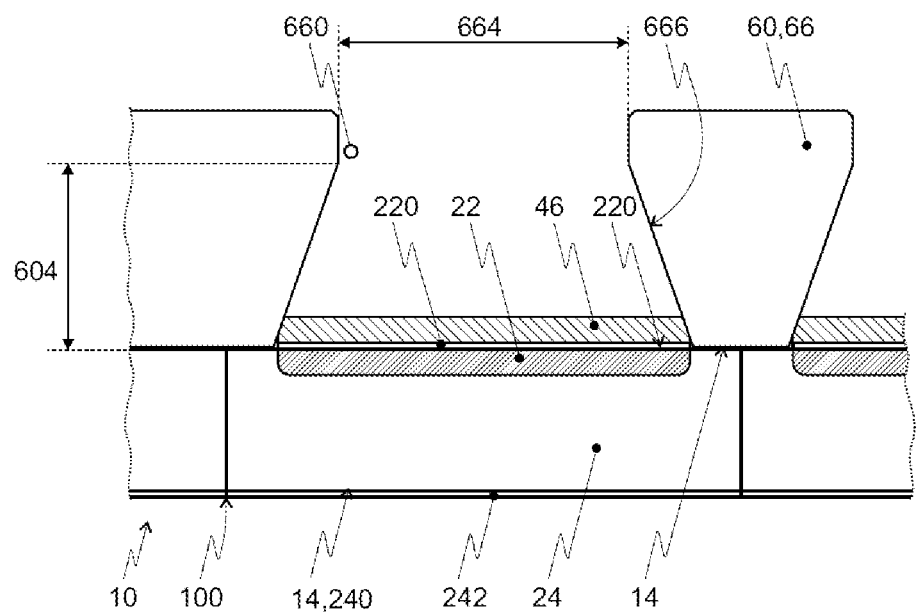
FIG. 7 shows a two-dimensional section through a further configuration of a first homogenizing device arranged with respect to a wafer.

FIG. 7 shows in an excerpt a two-dimensional section through a further configuration of a first homogenizing device 60, 66 arranged with respect to a wafer 10. Wafer 10, or semiconductor components 20 with assigned first contact metal layers 46, is identical to those in accordance with FIG. 6.

In contrast to FIG. 6, here homogenizing device 66 is arranged directly on first surface 12 of wafer 10 and leaves clear there first contact areas 220 of semiconductor components 20 that are to be contacted. The opening area of the respective cutouts 660 is spaced apart from first surface 12 of wafer 10. The edges of cutouts 660 run from first surface 12 of the wafer to the opening area at an angle with respect to the perpendicular to surface 12.

Figure 8:
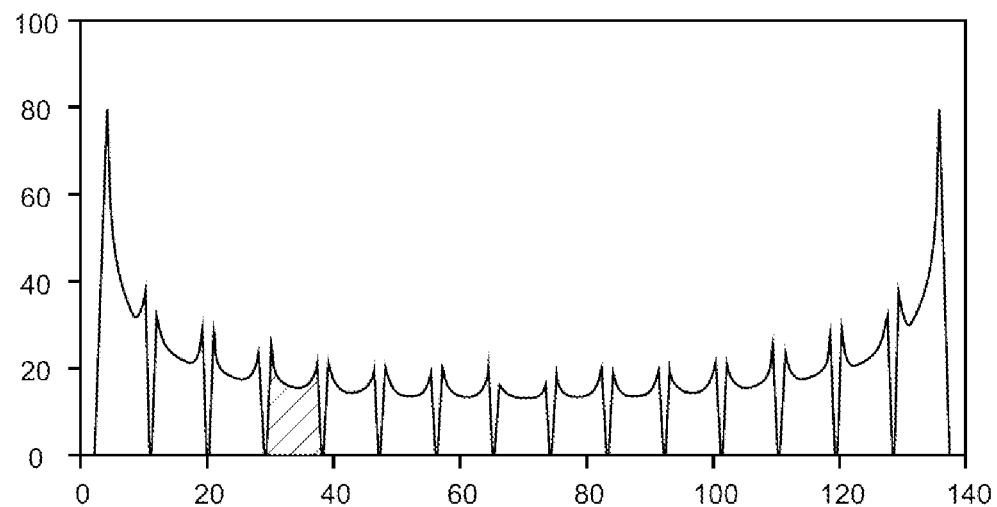
FIGS. 8 and 9 show simulation results of a method for the electrodeposition of a contact metal layer on contact areas of semiconductor components without and with a homogenizing device.
Figure 9:
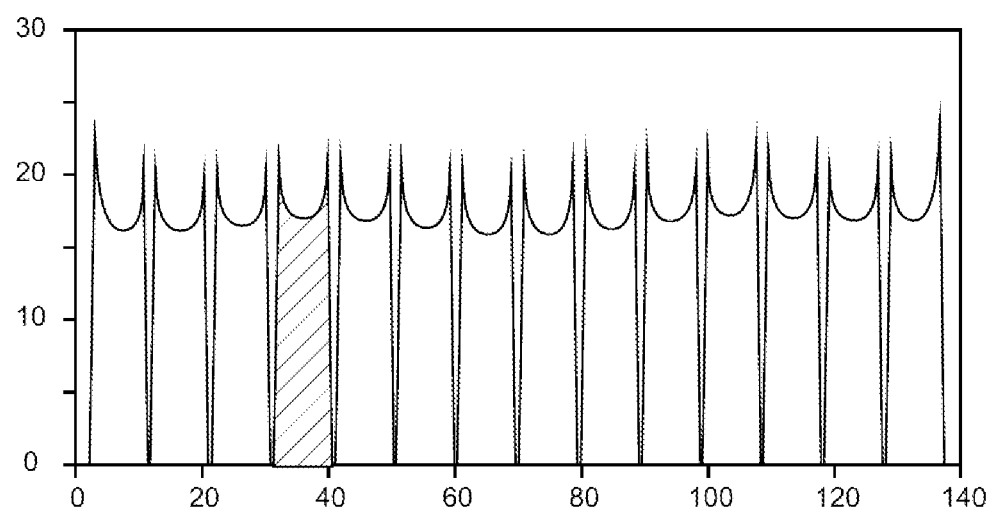

FIGS. 8 and 9 show simulation results of a method for the electrodeposition of a contact metal layer on contact areas of semiconductor components without and with a homogenizing device. The diameter of a wafer in millimetres is represented on the x-axis, and the deposition of a first metal contact layer in micrometers on the y-axis. Fifteen identical semiconductor components are assumed here along the x-axis. The surface area below the assigned curves is a direct measure of the deposited volume of the first contact metal layer.

The simulation results in FIGS. 8 and 9 differ exclusively to the effect that no homogenizing device was taken into account in the case of the simulation results in accordance with FIG. 8, and a homogenizing device in accordance with FIG. 5 was taken into account in the case of the simulation results in accordance with FIG. 9. As a result of the use of the homogenizing device, the deposited volume and thus also the average thickness of the deposited layer of the first contact metal layer over all the semiconductor components can be formed homogeneously in such a way that these differ by not more than about 5%.

In the preceding Detailed Description, reference was made to the accompanying drawings, which form a part of this disclosure, and in which are shown illustrative specific embodiments of the invention. In this regard, directional terminology, such as "top", "bottom", "left", "right", "front", "back", etc., is used with reference to the orientation of the Figure(s) with which such terms are used. Because components of embodiments can be positioned in a number of different orientations, the directional terminology is used for purposes of ease of understanding and illustration only and is not to be considered limiting.

Additionally, while there have been shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A method for the electrodeposition of a first contact metal layer on first contact areas of a plurality of semiconductor components, the plurality of semiconductor components being arranged in a matrix in a wafer assemblage which includes a wafer, the method comprising the following steps:
   a) providing a wafer assemblage having a plurality of semiconductor components thereon, wherein each semiconductor component has at least one pn junction and thus respectively a volume region of first and second dopings, wherein said volume region of said first doping adjoins a first surface of the respective semiconductor component and forms a respective first contact area thereon and said volume region of said second doping adjoins a second surface of said respective semiconductor component and forms a second contact area thereon, said wafer assemblage also having first and second surfaces;

b) arranging an electrically non-conductive homogenizing device with respect to said first surface of said wafer assemblage and thus with respect to said first surfaces of said semiconductor components, said homogenizing device including at least two cutouts, each of said cutouts being aligned over a respective one of said plurality of semiconductor components;

c) arranging an electrical contact device at said second surfaces of said wafer assemblage;

d) introducing said wafer assemblage with said arranged electrical contact device into an electroplating bath having an electrode, wherein the surface of said electrode consists at least partly of a first contact metal, and wherein said first surfaces of said semiconductor components are in contact with said electroplating bath; and e) applying a voltage to said electrode and to said contact device, thereby causing current to flow between said electrode and said contact device, through said electroplating bath and said semiconductor components, thereby depositing said first contact metal homogeneously at said first contact areas of said semiconductor components;

wherein said homogenizing device is spaced apart from said first surface of said wafer by a distance of up to about 25 mm.

2. The method of claim 1, wherein said first metal contact layer has a thickness of between about 1 μm and about 200 μm.

3. The method of claim 2, wherein said first metal contact layer has a thickness of between about 5 μm and about 20 μm.

4. The method of claim 1, wherein said first metal contact layer consists of at least about 90% copper.

5. The method of claim 1 wherein said wafer is enclosed in said contact device in a liquid-tight fashion such that said second surface of said wafer is protected against contact with said electroplating bath, and wherein said contact device has an external connection element.

6. The method of claim 1, wherein said homogenizing device is in direct contact with said first surface of said wafer.

* * * * *